US 11,462,655 B2

(12) United States Patent
Ahn

(10) Patent No.: US 11,462,655 B2
(45) Date of Patent: Oct. 4, 2022

(54) TANDEM SOLAR CELL AND METHOD OF MANUFACTURING THE SAME

(71) Applicant: LG ELECTRONICS INC., Seoul (KR)

(72) Inventor: Seh-Won Ahn, Seoul (KR)

(73) Assignee: LG Electronics Inc., Seoul (KR)

(*) Notice: Subject to any disclaimer, the term of this patent is extended or adjusted under 35 U.S.C. 154(b) by 146 days.

(21) Appl. No.: 15/676,160

(22) Filed: Aug. 14, 2017

(65) Prior Publication Data
US 2018/0158976 A1 Jun. 7, 2018

(30) Foreign Application Priority Data

Dec. 2, 2016 (KR) .................. 10-2016-0163838

(51) Int. Cl.
H02S 10/30 (2014.01)
H01L 31/078 (2012.01)
(Continued)

(52) U.S. Cl.
CPC ......... H01L 31/078 (2013.01); H01G 9/0029 (2013.01); H01G 9/2009 (2013.01);
(Continued)

(58) Field of Classification Search
CPC ............. H01L 31/078; H01L 31/02167; H01L 31/022466; H01L 31/02363;
(Continued)

(56) References Cited

U.S. PATENT DOCUMENTS

2009/0101202 A1*  4/2009  Sun .................... H01L 31/1804
                                                  136/256
2011/0265870 A1*  11/2011 Park .................. H01L 31/022425
                                                  136/256
(Continued)

FOREIGN PATENT DOCUMENTS

CN       101118914       2/2008
CN       101183687       5/2008
(Continued)

OTHER PUBLICATIONS

Werner, Jeremie, et al. "Efficient Monolithic Perovskite/Silicon Tandem Solar Cell with Cell Area >1 Cm2." The Journal of Physical Chemistry Letters, vol. 7, 2016, pp. 161-166. (Year: 2016).*
(Continued)

Primary Examiner — Bethany L Martin
Assistant Examiner — Kourtney R S Carlson
(74) Attorney, Agent, or Firm — Fish & Richardson P.C.

(57) ABSTRACT

The present disclosure relates to a tandem solar cell and a method of manufacturing the same, and more particularly, to a tandem solar cell having a perovskite solar cell stacked on and bonded to a silicon solar cell and a method of manufacturing the same. According to the present disclosure, a tandem solar cell embodied by using a homojunction silicon solar cell is provided with a first passivation pattern so that a part of an emitter layer under the first passivation pattern is exposed, thereby protecting, by the first passivation pattern, the emitter layer during high temperature firing for forming a second electrode, reducing surface defects of the emitter layer, and reducing a problem in that characteristics of the perovskite solar cell are degraded.

18 Claims, 6 Drawing Sheets

(51) Int. Cl.
| | |
|---|---|
| *H01L 31/0216* | (2014.01) |
| *H01L 51/44* | (2006.01) |
| *H01L 31/0224* | (2006.01) |
| *H01L 27/30* | (2006.01) |
| *H01L 51/00* | (2006.01) |
| *H01G 9/00* | (2006.01) |
| *H01G 9/20* | (2006.01) |
| *H01L 31/0236* | (2006.01) |
| *H01L 31/0687* | (2012.01) |
| *H01L 31/0725* | (2012.01) |
| *H01L 31/18* | (2006.01) |
| *H01L 51/42* | (2006.01) |

(52) U.S. Cl.
CPC ...... *H01L 27/302* (2013.01); *H01L 31/02167* (2013.01); *H01L 31/02363* (2013.01); *H01L 31/022466* (2013.01); *H01L 31/0687* (2013.01); *H01L 31/0725* (2013.01); *H01L 31/1804* (2013.01); *H01L 31/186* (2013.01); *H01L 31/1884* (2013.01); *H01L 51/0096* (2013.01); *H01L 51/4213* (2013.01); *H01L 51/442* (2013.01); *Y02E 10/549* (2013.01)

(58) Field of Classification Search
CPC ............. H01L 31/0687; H01L 31/0725; H01L 51/0096; H01L 51/4213; H01L 51/442; H01L 27/302
USPC .................................................. 136/242–265
See application file for complete search history.

(56) References Cited

U.S. PATENT DOCUMENTS

| | | | | |
|---|---|---|---|---|
| 2012/0174960 | A1* | 7/2012 | Hashigami | H01L 31/02167 |
| | | | | 136/244 |
| 2015/0040973 | A1 | 2/2015 | Choi et al. | |
| 2016/0035927 | A1* | 2/2016 | Gershon | H01L 31/0326 |
| | | | | 136/244 |
| 2016/0126401 | A1 | 5/2016 | Iannelli et al. | |
| 2016/0163904 | A1 | 6/2016 | Mailoa et al. | |
| 2018/0277691 | A1* | 9/2018 | Karkkainen | G02B 1/111 |

FOREIGN PATENT DOCUMENTS

| | | | |
|---|---|---|---|
| CN | 102693842 | 9/2012 | |
| CN | 104769736 | 7/2015 | |
| CN | 106025087 | 10/2016 | |
| CN | 106058054 | 10/2016 | |
| JP | 2003-124481 | 4/2003 | |
| JP | 2003124481 | 4/2003 | |
| JP | 2009212122 | 9/2009 | |
| JP | 2014090020 | 5/2014 | |
| JP | 2014090020 A | 5/2014 | |
| JP | 2015535390 A | 12/2015 | |
| WO | 2015017885 A1 | 2/2015 | |
| WO | WO-2015092397 A1 * | 6/2015 | ....... H01L 31/02167 |

OTHER PUBLICATIONS

Mackel, H, and R Ludemann. "Detailed Study of the Composition of Hydrogenated SiNx Layers for High-Quality Silicon Surface Passivation." Journal of Applied Physics, vol. 92, No. 5, Sep. 1, 2002, pp. 2602-2609. (Year: 2002).*
Albrecht, Steve, et al. "Monolithic Perovskite/Silicon-Heterojunction Tandem Solar Cells Processed at Low Temperature." Energy & Environmental Science, vol. 9, No. 1, 2016, pp. 81-88., https://doi.org/10.1039/c5ee02965a. (Year: 2016).*
Albrecht et al., "Monolithic Perovskite/Silicon-Heterojunction Tandem Solar Cells Processed at Low Temperature," Energy & Environmental Science, Oct. 23, 2015, 9 pages.
Santbergen et al., "Minimizing optical losses in monolithic perovskite/c-Si tandem solar cells with a flat top cell," Optics Express, Optical Society of America, Aug. 26, 2016, vol. 24, No. 18, A1288-A1299.
Werner et al., "Efficient Near-Infrared-Transparent Perovskite Solar Cells Enabling Direct Comparison of 4-Terminal and Monolithic Perovskite/Silicon Tandem Cells," ACS Energy Letters, American Chemical Society, Jun. 30, 2016, vol. 1, No. 1, p. 474-480.
Extended European Search Report in European Application No. 17180470.1, dated Nov. 24, 2017, 10 pages (with English translation).
Chinese Office Actions in Chinese Appln. No. 201710670180.8, dated Jul. 7, 2020, 18 pages (with English translation).
Japanese Office Action in Japanese Appln. No. 2019-149055, dated Sep. 1, 2020, 5 pages (with English translation).
Santbergen et al. "Minimizing optical losses in monolithic perovskite/c-Si tandem solar cells with a flat top cell," Optics Express, Sep. 2016, 12 pages.
Chinese Office Action in CN Appln. No. 201710670180.8, dated Dec. 11, 2020, 8 pages (with English translation).

* cited by examiner

TANDEM SOLAR CELL AND METHOD OF MANUFACTURING THE SAME

CROSS-REFERENCE TO RELATED APPLICATION

This application claims priority to and the benefit of Korean Patent Application No. 10-2016-0163838, filed on Dec. 2, 2016, the disclosure of which is incorporated herein by reference in its entirety.

TECHNICAL FIELD

The present disclosure relates to a tandem solar cell and a method of manufacturing the same, and more particularly, to a tandem solar cell having a perovskite solar cell stacked on and bonded to a silicon solar cell and a method of manufacturing the same.

BACKGROUND

A crystalline silicon (c-Si) solar cell is a typical single junction solar cell and has dominated the solar cell market for decades.

However, although a bandgap of c-Si is almost ideal when considering the Shockley-Queisser limit, photoelectric conversion efficiency of a silicon-based solar cell is limited to about 30% according to Auger recombination.

That is, photoelectric efficiency of a conventional c-Si solar cell is lowered due to a thermalization loss occurring when a photon having much higher energy than a bandgap of the c-Si solar cell is incident thereon and a transmission loss of a photon having lower energy than the bandgap.

Here, the thermalization loss is a loss generated when excess energy of light absorbed by a solar cell is lost as thermal energy without being converted into photons in a quantum form of lattice vibration, and the transmission loss refers to a loss generated when photons having lower energy than a bandgap of the solar cell do not sufficiently excite electrons.

Because a bandgap having an appropriate size is required and a low bandgap is also required so that low-energy photons can contribute to a reduction of a thermalization loss in a single junction solar cell, there is a trade-off relationship between the bandgap having an appropriate size and the low bandgap.

Since such a trade-off relationship is difficult to solve with a single junction solar cell, attempts have recently been made to effectively utilize light energy in a wide spectral range using materials having various energy bandgaps such as a tandem solar cell or a double-junction solar cell.

As one of the attempts, a tandem solar cell, which forms one solar cell by connecting single junction solar cells including absorption layers having different bandgaps, has been proposed.

Generally, in a tandem solar cell, a single junction solar cell having an absorption layer having a relatively large bandgap is located at an upper portion thereof to primarily receive incident light, and a single junction solar cell having an absorption layer having a relatively small band gap is located at a lower portion thereof.

Accordingly, since the upper portion of the tandem solar cell absorbs light in a short wavelength band and the lower portion absorbs light in a long wavelength band, a threshold wavelength can be changed to a long wavelength so that an entire absorption wavelength band can be widely used.

In addition, by using the entire absorption wavelength band divided into two bands, a thermal loss during electron-hole generation can be expected to be reduced.

Such tandem solar cells can be roughly classified into a two-terminal tandem solar cell and a four-terminal tandem solar cell according to a junction type of single junction solar cells and locations of electrodes.

Specifically, a two-terminal tandem solar cell has a structure in which two sub-solar cells are tunnel-bonded and electrodes are provided on upper and lower portions of a tandem solar cell, and a four-terminal tandem solar cell has a structure in which two sub-solar cells are spaced apart from each other and electrodes are provided on upper and lower portions of each sub-solar cell.

A two-terminal tandem solar cell is attracting attention as a next generation solar cell because resistance of a four-terminal tandem solar cell is high and an optical loss thereof is inevitably generated due to the four-terminal tandem solar cell requiring sub-solar cells each mounted on a separate substrate and relatively large transparent conductive junctions when compared with the two-terminal tandem solar cell.

FIG. 1 is a schematic view illustrating a general two-terminal tandem solar cell.

Referring to FIG. 1, in the general solar cell, a single junction solar cell including an absorption layer having a relatively large bandgap and a single junction solar cell including an absorption layer having a relatively small bandgap are tunnel-bonded with an inter-layer as an intermediary therebetween.

Among various types of two-terminal tandem solar cells, a perovskite/c-Si tandem solar cell which uses the single junction solar cell including the absorption layer having the relatively large bandgap as a perovskite solar cell and uses the single junction solar cell including the absorption layer having the relatively small bandgap as a c-Si solar cell is attracting attention as a potential candidate that can achieve a photovoltaic efficiency of 30% or more.

In the perovskite/c-Si tandem solar cell, the perovskite solar cell is deposited on the inter-layer after the inter-layer is formed on the c-Si solar cell.

Although not shown in the drawing in detail, in the general tandem solar cell, a rear metal electrode is disposed on a rear surface of the c-Si solar cell, and a front metal electrode is disposed on a front surface of the perovskite solar cell.

At this time, each of the rear metal electrode and the front metal electrode is coated with an electrode paste, to which a glass frit is added, and formed by firing the rear metal electrode and the front metal electrode at a high temperature of 700° C. or higher.

That is, in the case of the general tandem solar cell, after the perovskite solar cell is formed and coated with the electrode paste to which the glass frit is added, the rear metal electrode and front metal electrode are simultaneously fired and formed at a high temperature of 700° C. or higher.

As a result, in the general tandem solar cell, since the perovskite solar cell is bonded to the c-Si solar cell and then the rear metal electrode and the front metal electrode are formed, there is a problem in that characteristics of the perovskite solar cell are degraded because the perovskite solar cell itself is exposed to a high temperature of 700° C. or higher.

SUMMARY

The present disclosure is directed to providing a tandem solar cell which is embodied by using a homojunction silicon solar cell and is capable of reducing a problem in that characteristics of a perovskite solar cell are degraded by using a first passivation pattern to expose a part of an emitter layer under the first passivation pattern so that the emitter layer is protected by the first passivation pattern and surface defects of the emitter layer are reduced during high temperature firing for forming a second electrode, and a method of manufacturing the same.

The present disclosure is also directed to providing a tandem solar cell capable of improving electrical connection reliability between a silicon solar cell and a perovskite solar cell by directly bonding an inter-layer, which is stacked on an emitter layer and a first passivation pattern, to a part of the emitter layer using the first passivation pattern, and a method of manufacturing the same.

The present disclosure is also directed to providing a tandem solar cell capable of improving a utilization ratio of long wavelength light in a silicon solar cell as well as reducing reflectance of an interface between an inter-layer and the silicon solar cell by being designed to have a textured structure having a texturing pattern, which is disposed on at least one of a first surface and a second surface of a crystalline silicon substrate, and a method of manufacturing the same.

According to an aspect of the present disclosure, there is provided a tandem solar cell including: a silicon solar cell including an emitter layer disposed on a first surface of a crystalline silicon substrate and a first passivation pattern disposed in the emitter layer and patterned to have an opening through which a part of the emitter layer is exposed; a perovskite solar cell including a perovskite absorption layer; an inter-layer disposed on the first passivation pattern of the silicon solar cell and the emitter layer exposed through the opening and configured to bond the silicon solar cell and the perovskite solar cell; a first electrode disposed on the perovskite solar cell; and a second electrode disposed on a second surface of the crystalline silicon substrate.

According to another aspect of the present disclosure, there is provided a method of manufacturing a tandem solar cell, which includes: forming an emitter layer on a first surface of a crystalline silicon substrate; forming a first passivation layer on the emitter layer; forming a second electrode on a second surface of the crystalline silicon substrate; forming a silicon solar cell having a first passivation pattern made by etching a part of the first passivation layer and patterned to have an opening through which a part of the emitter layer is exposed; forming an inter-layer on the emitter layer, which is exposed through the opening, and the first passivation pattern; forming a perovskite solar cell having a perovskite absorption layer on the inter-layer; and forming a first electrode on the perovskite solar cell.

BRIEF DESCRIPTION OF THE DRAWINGS

The above and other objects, features and advantages of the present disclosure will become more apparent to those of ordinary skill in the art by describing exemplary implementations thereof in detail with reference to the accompanying drawings, in which.

DETAILED DESCRIPTION

Hereinafter, a tandem solar cell and a method of manufacturing the same according to exemplary implementations of the present disclosure will be described in detail with reference to the accompanying drawings of the present disclosure.

The present disclosure is not to be construed as being limited to the exemplary implementations set forth herein, and may be embodied in many different forms. Rather, the implementations are provided so that the present disclosure is thorough and complete and may fully convey the scope of the disclosure to those skilled in the art.

[Tandem Solar Cell]

First Implementation

Figure 1:
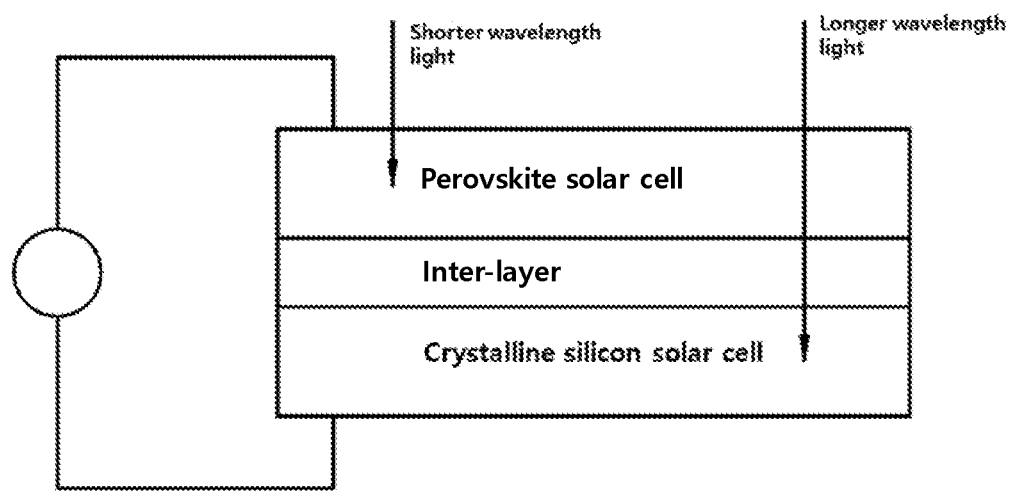
FIG. 1 is a schematic view illustrating a general tandem solar cell.
Figure 2:
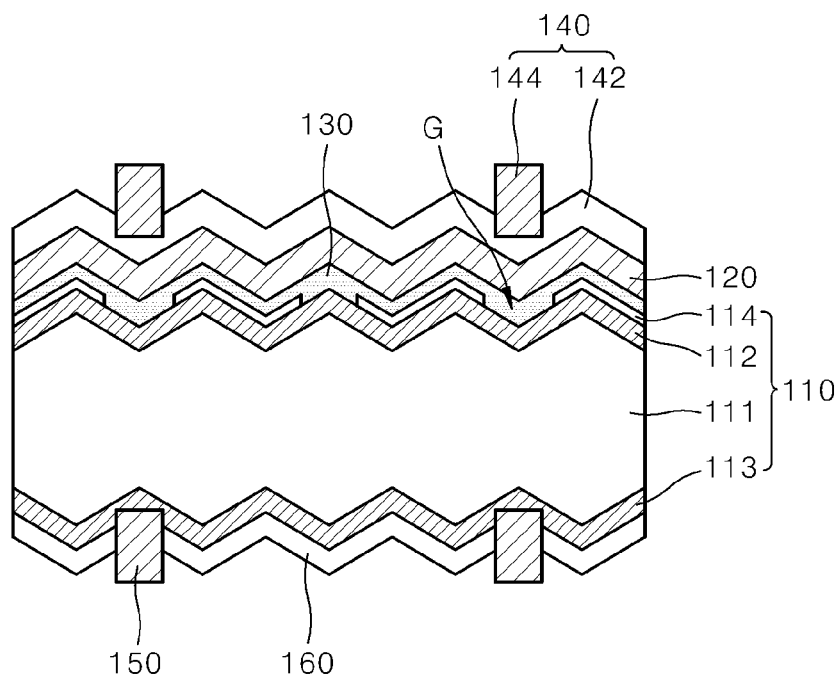
FIG. 2 is a cross-sectional view illustrating a tandem solar cell according to a first implementation of the present disclosure.
Figure 3:
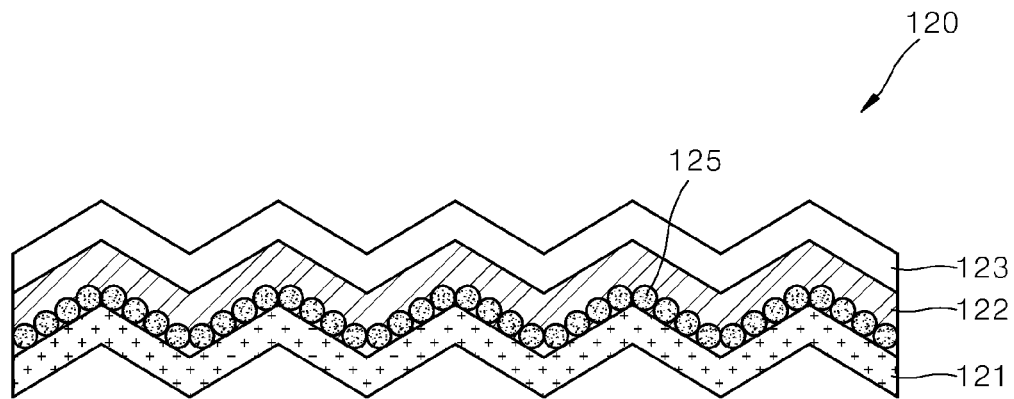
FIG. 3 is a cross-sectional view illustrating a perovskite solar cell of FIG. 2 in detail.

FIG. 2 is a cross-sectional view illustrating a tandem solar cell according to a first implementation of the present disclosure, and FIG. 3 is a cross-sectional view illustrating a perovskite solar cell of FIG. 2 in detail.

Referring to FIGS. 2 and 3, a tandem solar cell 100 according to the first implementation of the present disclosure has a structure of a two-terminal tandem solar cell in which a perovskite solar cell 120 including an absorption layer having a relatively large bandgap is directly tunnel-bonded to a silicon solar cell 110 including an absorption layer having a relatively small bandgap using an inter-layer 130 as an intermediary.

Accordingly, the perovskite solar cell 120 disposed in an upper portion of the tandem solar cell 100 absorbs light in a short wavelength band of light which is incident on the tandem solar cell 100 and generates a charge, and the silicon solar cell 110 disposed in a lower portion thereof absorbs light in a long wavelength band, which passes through the perovskite solar cell 120, and generates a charge.

In the tandem solar cell 100 having the above-described structure, since the perovskite solar cell 120 disposed in the upper portion absorbs the light in a short wavelength band to generate the charge and the silicon solar cell 110 disposed in the lower portion absorbs the light in a long wavelength band to generate the charge, a threshold wavelength can be changed to a long wavelength, and thus a wavelength band of an entire solar cell for absorbing light can be widened.

The above-described tandem solar cell 100 according to the first implementation of the present disclosure includes the silicon solar cell 110, the perovskite solar cell 120, the inter-layer 130, a first electrode 140, and a second electrode 150.

The silicon solar cell 110 may be embodied by using a homojuction crystalline silicon solar cell. Specifically, the silicon solar cell 110 has an emitter layer 112 disposed on a first surface of a crystalline silicon substrate 111. In addition, the silicon solar cell 110 may further have a rear electric field layer 113 disposed on a second surface of the crystalline silicon substrate 111. That is, the silicon solar cell 110 may have a two-layer structure in which the crystalline silicon substrate 111 and the emitter layer 112 are sequentially stacked. Alternatively, the silicon solar cell 110 may have a three-layer structure in which the rear electric field layer 113, the crystalline silicon substrate 111, and the emitter layer 112 are sequentially stacked.

Here, in order to implement the homojunction crystalline silicon solar cell 110, an impurity doping layer having different conductivity from the crystalline silicon substrate 111 may be used as the emitter layer 112, and an impurity doping layer having the same conductivity as the crystalline silicon substrate 111 may be used as the rear electric field layer 113.

For example, when the crystalline silicon substrate 111 is an N-type single crystalline silicon substrate, a semiconductor layer doped with a P-type impurity is used as the emitter layer 112 and a semiconductor layer doped with an N-type impurity is used as the rear electric field layer 113. At this time, the rear electric field layer 113 may be an $N^+$-type semiconductor layer doped with a higher concentration of N-type impurities than that of N-type impurities doped in the crystalline silicon substrate 111.

In addition, the crystalline silicon substrate 111 may use a P-type single crystalline silicon substrate or another crystalline silicon substrate which is normally used in the crystalline silicon solar cell instead of the N-type single crystalline silicon substrate. In addition, the emitter layer 112 and the rear electric field layer 113 may also be designed to be doped with an impurity having an appropriate conductivity based on a conductivity of the crystalline silicon substrate 111.

Here, the crystalline silicon substrate 111 of the silicon solar cell 110 has a textured structure having a texturing pattern disposed in at least one of the first surface and the second surface.

As described above, the textured structure is provided on the second surface of the crystalline silicon substrate 111, and the rear electric field layer 113 and a second passivation layer 160 sequentially disposed on the second surface of the crystalline silicon substrate 111 also have textured structures. In addition, since the textured structure is provided on the first surface of the crystalline silicon substrate 111, the emitter layer 112, the first passivation pattern 114, the inter-layer 130, and the perovskite solar cell 120 sequentially provided on the first surface of the crystalline silicon substrate 111 also have textured structures.

Accordingly, since light having a long wavelength which is incident on the tandem solar cell 100 passes through the perovskite solar cell 120 in a diagonal direction and is incident on the silicon solar cell 110, reflectance of an interface between the inter-layer 130 and the silicon solar cell 110 can be reduced. Further, since a moving path of the light having a long wavelength is formed in the diagonal direction in the silicon solar cell 110, a path of the light may be lengthened so that a utilization ratio of the light having a long wavelength in the silicon solar cell 110 can be improved.

The silicon solar cell 110 further includes a patterned first passivation pattern 114 disposed on the emitter layer 112 and having an opening G through which a part of the emitter layer 112 is exposed.

A material of the first passivation pattern 114 may generally include a $SiN_x$:H material containing hydrogen and capable of reducing defects of the crystalline silicon substrate 111 or may include another insulating film including hydrogen, or another film or a multilayer structure including one or more selected from among $SiO_x$, $SiN_x$, $SiO_xN_y$, $Al_2O_3$, $SiC_x$, and the like may be applied thereto.

At this time, the first passivation pattern 114 has to be formed as thinly as possible to decrease reflectance of the light having a long wavelength. To this end, the first passivation pattern 114 preferably has a thickness of 10 to 100 nm. When the thickness of the first passivation pattern 114 is less than 10 nm, the emitter layer 112 is not stably protected during a process of forming the second electrode 150 because the thickness is very small, and thus surface defects of the emitter layer 112 may occur. Conversely, a case in which the thickness of the first passivation pattern 114 is greater than 100 nm is not preferable because a problem in that the reflectance of the light having a long wavelength decreases may occur.

The perovskite solar cell 120 has a perovskite absorption layer 122. In addition, the perovskite solar cell 120 further includes an electron transfer layer 121 and a hole transfer layer 123.

At this time, the electron transfer layer 121 may be disposed under the perovskite absorption layer 122, and the hole transfer layer 123 may be disposed on the perovskite absorption layer 122. At this time, locations of the electron transfer layer 121 and the hole transfer layer 123 may be switched if necessary.

The electron transfer layer 121 may include a metal oxide. Non-limiting examples of the metal oxide included in the electron transfer layer 121 include Ti oxide, Zn oxide, In oxide, Sn oxide, W oxide, Nb oxide, Mo oxide, Mg oxide, Zr oxide, Sr oxide, Yr oxide, La oxide, V oxide, Al oxide, Y oxide, Sc oxide, Sm oxide, Ga oxide, In oxide, SrTi oxide, etc. More preferably, the electron transfer layer 121 may include at least one metal oxide selected from ZnO, $TiO_2$, $SnO_2$, $WO_3$, and $TiSrO_3$.

In addition, a mesoporous layer 125 including a metal oxide, which is the same as or different from that of electron transfer layer 121, may also be provided on the electron transfer layer 121. Particularly after hole-electron pairs generated by the perovskite absorption layer 122 are decomposed into electrons and holes, the mesoporous layer 125 serves to easily transfer the electrons to the inter-layer 130, which will be described below. In addition, since the mesoporous layer 125 is formed to have an optical scattering structure, the mesoporous layer 125 also serves to increase an optical path.

The perovskite absorption layer 122 is a photoactive layer including a compound having a perovskite structure, and the perovskite structure may be displayed as $AMX_3$ (here, "A" refers to a monovalent organic ammonium cation or metal cation; "M" refers to a divalent metal cation; and "X" refers to a halogen anion). Non-limiting examples of the compound having a perovskite structure include $CH_3NH_3PbI_3$, $CH_3NH_3PbI_xCl_{3-x}$, $CH_3NH_3PbI_xBr_{3-x}$, $CH_3NH_3PbCl_xBr_{3-x}$, $HC(NH_2)_2PbI_3$, $HC(NH_2)_2PbI_xCl_{3-x}$, $HC(NH_2)_2PbI_xBr_{3-x}$, $HC(NH_2)_2PbCl_xBr_{3-x}$, $(CH_3NH_3)(HC(NH_2)_2)_{1-y}PbI_3$, $(CH_3NH_3)(HC(NH_2)_2)_{1-y}PbI_xCl_{3-x}$, $(CH_3NH_3)(HC(NH_2)_2)_{1-y}PbI_xBr_{3-x}$, $(CH_3NH_3)(HC(NH_2)_2)_{1-y}PbCl_xBr_{3-x}$, and the like (0<=x and y<=1). A case in which some of "A" included in $AMX_3$ may be doped with Cs may also be included therein.

The hole transfer layer 123 may be embodied by using a conductive polymer. That is, the conductive polymer may include polyaniline, polypyrrole, polythiophene, poly-3,4-ethylene dioxythiophene-polystyrene sulfonate (PEDOT-PSS), poly-[bis(4-phenyl)(2,4,6-trimethylphenyl)amine] (PTAA), Spiro-MeOTAD, polyaniline-camphorsulfonic acid (PANT-CSA), etc. At this time, the hole transfer layer 123 may further include an N-type or P-type dopant if necessary.

The inter-layer 130 is disposed on the first passivation pattern 114 of the silicon solar cell 110 and the emitter layer 112 which is exposed through the opening and severs to bond the silicon solar cell 110 and the perovskite solar cell 120. Accordingly, the perovskite solar cell 120 is electrically connected to the silicon solar cell 110 through an intermediary of the inter-layer 130.

When a first passivation layer (not shown) is designed to cover an entire upper surface of the emitter layer 112, the entire upper surface of the emitter layer 112 is blocked by the first passivation layer, and thus a problem in that the emitter layer 112, the inter-layer 130, and the perovskite solar cell 120 are not electrically connected may occur. In addition, when the inter-layer 130 and the perovskite solar cell 120 are directly formed on the emitter layer 112 without the first passivation pattern 114 disposed therebetween, characteristics of the perovskite solar cell 120 bonded to the silicon solar cell 110 may be degraded due to surface defects of the emitter layer 112.

To this end, first passivation patterns 114 designed to be spaced a predetermined gap from each other and disposed on the emitter layer 112 are provided in the present disclosure so that a part of the emitter layer 112 under the first passivation pattern 114 is exposed. As a result, in the present disclosure, when high temperature firing for forming the second electrode 150 is performed, the emitter layer 112 is protected by the first passivation pattern 114 and surface defects of the emitter layer 112 are reduced, and thus a problem in that characteristics of the perovskite solar cell 120 are degraded can be reduced. Further, electrical connection reliability between the silicon solar cell 110 and the perovskite solar cell 120 can be improved by directly bonding the inter-layer 130 stacked on the emitter layer 112 and the first passivation pattern 114 to a part of the emitter layer 112.

As described above, the inter-layer 130 electrically connects the silicon solar cell 110 and the perovskite solar cell 120. In addition, the inter-layer 130 may be embodied by using a transparent conductive oxide, a carbonaceous conductive material, a metallic material, or a conductive polymer so that the light having a long wavelength which passes through the perovskite solar cell 120 is incident on the silicon solar cell 110 disposed thereunder without transmission loss. In addition, the inter-layer 130 doped with an N-type or P-type material may be used.

At this time, the transparent conductive oxide may include indium tin oxide (ITO), zinc indium tin oxide (ZITO), zinc indium oxide (ZIO), zinc tin oxide (ZTO), gallium indium tin oxide (GITO), gallium indium oxide (GIO), gallium zinc oxide (GZO), aluminum doped zinc oxide (AZO), fluorine tin oxide (FTO), ZnO, etc. The carbonaceous conductive material may include graphene, a carbon nanotube, or the like, and the metallic material may include a metallic (Ag) nanowire or a metal thin film having a multilayer structure of Au/Ag/Cu/Mg/Mo/Ti. The conductive polymer may include polyaniline, polypyrrole, polythiophene, PEDOT-PSS, PTAA, Spiro-MeOTAD, PANI-CSA, etc.

In addition, the inter-layer 130 may be embodied by using a multilayer structure in which silicon layers having different refractive indices are alternately stacked multiple times. At this time, the multilayer structure may have a structure in which low refractive index layers and high refractive index layers are alternately stacked. Accordingly, light having a short wavelength is reflected toward the perovskite solar cell 120 and light having a long wavelength is transmitted to the silicon solar cell 110 on the basis of the inter-layer 130. Accordingly, the perovskite/silicon tandem solar cell 100 can selectively collect light.

Here, a structure in which low refractive index layers and high refractive index layers are alternately stacked is provided on or under a transparent conductive oxide layer or $N^+$-type silicon layer so that selective reflection and transmission of light can be embodied as described above.

The first electrode 140 is disposed on the perovskite solar cell 120. At this time, the first electrode 140 may be in a grid form and directly disposed on the perovskite solar cell 120. That is, the first electrode 140 may be formed with only a grid electrode layer 144 directly disposed on the perovskite solar cell 120 without a transparent electrode layer 142.

In this case, the first electrode 140 may be made by selectively coating the perovskite solar cell 120 with a first electrode paste excluding a glass frit and firing the coated perovskite solar cell 120 at a low temperature of 250° C. or lower. Such a first electrode paste may include an inorganic additive for fire-through but the inorganic additive for fire-through may be omitted if necessary.

In addition, the first electrode 140 may include the transparent electrode layer 142 disposed on the perovskite solar cell 120 and the grid electrode layer 144 disposed on the transparent electrode layer 142.

At this time, the transparent electrode layer 142 is formed on an entire upper surface of the perovskite solar cell 120 and serves to collect the charge generated by the perovskite solar cell 120. Such a transparent electrode layer 142 may be embodied by using any of various transparent conductive materials. That is, the transparent conductive material may be the same as a transparent conductive material of the inter-layer 130.

The grid electrode layer 144 is disposed on the transparent electrode layer 142 and is disposed on a part of the transparent electrode layer 142.

The second electrode 150 is disposed on the second surface of the crystalline silicon substrate 111. At this time, the second passivation layer 160 may also be disposed on the second surface of the crystalline silicon substrate 111, but the second passivation layer 160 is not necessarily disposed thereon and may be omitted if necessary. The second passivation layer 160 may include one or more selected from $SiO_x$, $SiN_x$, $SiO_xN_y$, $Al_2O_3$, $SiC_x$, etc.

Here, the second electrode 150 passes through the second passivation layer 160 and is electrically connected to the rear electric field layer 113. To this end, the second electrode 150 passes through the second passivation layer 160 and is electrically connected to a lower surface of the rear electric field layer 113 by selectively coating a lower surface of the second passivation layer 160 with a second electrode paste including a glass frit and an inorganic additive for fire-through and firing the coated lower surface at a high temperature of 700° C. or higher.

At this time, the inorganic additive for fire-through refers to a component capable of allowing a predetermined film to be fired-through a layer at a firing temperature. That is, the term "fire-through" means that the second passivation layer 160 is penetrated due to a chemical reaction with a component included in the second passivation layer 160 during firing.

To this end, the inorganic additive for fire-through may include at least one selected from a nitride, an oxide, a metal having higher oxidizing power than a combination of a nitride and an oxide, and an oxide of the metal. Accordingly, a nitride, an oxide, or a combination thereof is oxidized and the inorganic additive is reduced by high temperature firing, and thus the second passivation layer 160 may be penetrated.

To this end, the inorganic additive for fire-through may include one or more selected from tin (Sn), zinc (Zn), strontium (Sr), magnesium Mg, silver (Ag), lead (Pb), bismuth (Bi), molybdenum (Mo), technetium (Tc), ruthenium (Ru), rhodium (Rh), tungsten (W), rhenium (Re), osmium (Os), iridium (Ir), platinum (Pt), manganese (Mn), chromium (Cr), iron (Fe), copper (Cu), cobalt (Co), palladium (Pd), nickel (Ni), and an oxide thereof.

The second electrode 150 is disposed on a part of the lower surface of the second passivation layer 160, passes through the second passivation layer 160, and is electrically connected to the rear electric field layer 113.

Accordingly, charges generated by the silicon solar cell 110 are collected by the second electrode 150. At this time, the second electrode 150 is preferably designed to be selectively disposed on a part of the lower surface of the second passivation layer 160 instead of being disposed on the entirely lower surface of the second passivation layer 160 so that photovoltaic light from a lower surface of the silicon solar cell 110 is incident thereon.

At this time, the second electrode 150 is preferably disposed to occupy 1 to 30% of a total area of the lower surface of the second passivation layer 160. When an occupied area of the second electrode 150 is less than 1%, an effect of the second electrode 150 collecting the charge generated by the silicon solar cell 110 may be insufficient. On the contrary, when the occupied area of the second electrode 150 is greater than 30%, the area occupied by the second electrode 150 is excessively wide, and thus a utilization ratio of light which is incident from a rear surface of the silicon solar cell 110 may be lowered.

At this time, in the present disclosure, instead of simultaneously forming the first electrode 140 and the second electrode 150, two processes, i.e., a process of forming the first electrode 140 by firing at a low temperature of 250° C. or lower using a first electrode paste excluding a glass frit and a process of forming the second electrode 150 by firing at a high temperature of 700° C. or higher, are performed.

Particularly, the second electrode 150 is formed by a high temperature firing process, and then the perovskite solar cell 120 and the first electrode 140 are sequentially formed. As a result, since the perovskite solar cell 120 is exposed during only a firing process at a low temperature of 250° C. or lower for forming the first electrode 140 and is not exposed during a firing process at a high temperature of 700° C. or higher for forming the second electrode 150, a problem in that the perovskite solar cell 120 is degraded by the high temperature firing can be prevented.

As described above, according to the first implementation of the present disclosure, a first passivation pattern, in which patterns are designed to be disposed on an emitter layer and spaced a predetermined gap from each other, is provided so that a part of the emitter layer under the first passivation pattern is exposed.

As a result, in the tandem solar cell according to the first implementation of the present disclosure, the emitter layer is protected by the first passivation pattern and surface defects of the emitter layer are reduced during high temperature firing for forming a second electrode, thereby reducing a problem in that characteristics of a perovskite solar cell are degraded.

Further, the tandem solar cell according to the first implementation of the present disclosure can improve electrical connection reliability between a silicon solar cell and a perovskite solar cell by directly bonding an inter-layer, which is stacked on an emitter layer and a first passivation pattern, to a part of the emitter layer using the first passivation pattern.

In addition, since the tandem solar cell according to the first implementation of the present disclosure is designed to have a textured structure having a texturing pattern disposed in at least one of a first surface and a second surface of a crystalline silicon substrate, reflectance of an interface between an inter-layer and a silicon solar cell can be reduced and a utilization ratio of light having a long wavelength in the silicon solar cell can also be improved.

Second Implementation

Figure 4:
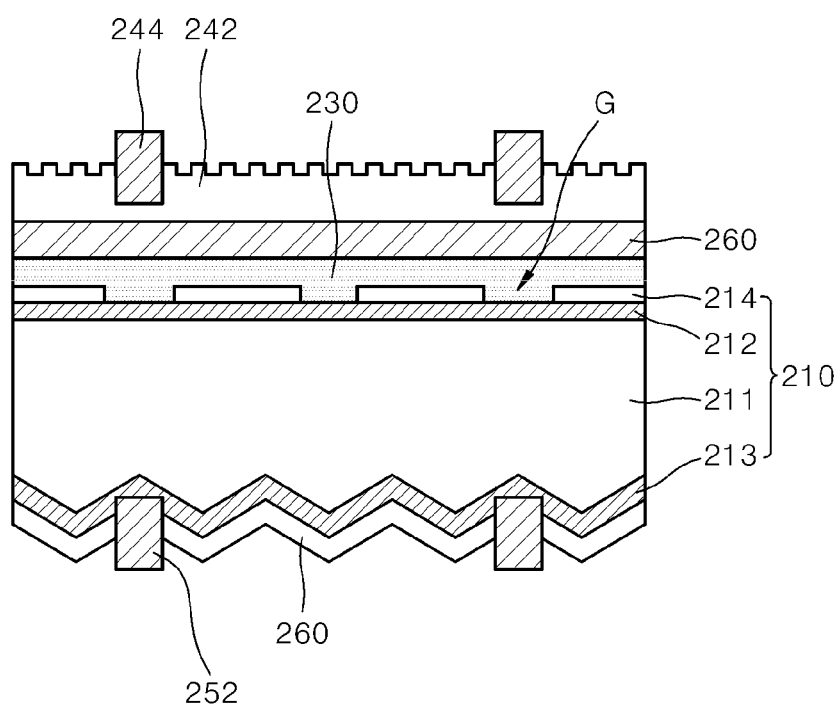
FIG. 4 is a cross-sectional view illustrating a tandem solar cell according to a second implementation of the present disclosure.

FIG. 4 is a cross-sectional view illustrating a tandem solar cell according to a second implementation of the present disclosure.

Referring to FIG. 4, a tandem solar cell 200 according to the second implementation of the present disclosure includes first and second electrodes 240 and 250 which have different structures from the first and second electrodes 140 and 150 of the tandem solar cell 100 according to the first implementation shown in FIG. 2.

The first electrode 240 is disposed on a perovskite solar cell 220 and includes a transparent electrode layer 242 having a concave and convex structure and a first grid electrode layer 244 disposed on the transparent electrode layer 242.

The second electrode 250 includes a second grid electrode layer 252 in contact with a rear electric field layer 213.

In addition, since the transparent electrode layer 242 of the first electrode 240 is formed to have a concave and convex structure which is different from the first electrode 140 of the tandem solar cell 100 according to the first implementation shown in FIG. 2, the tandem solar cell 200 according to the second implementation of the present disclosure is provided with a textured structure having a texturing pattern in only a lower surface of a crystalline silicon substrate 211.

As described above, even when a textured structure is not provided on an upper surface of a crystalline silicon solar cell 210, light having a long wavelength and passing through the perovskite solar cell 220 is refracted in a diagonal direction by the transparent electrode layer 242 and is incident on the crystalline silicon solar cell 210, and thus light reflected by an interface between an inter-layer 230 and the crystalline silicon solar cell 210 can be reduced.

At this time, although the concave and convex pattern provided on the transparent electrode layer 242 is designed to be integrated with the transparent electrode layer 242, the present disclosure is not limited thereto. That is, the concave and convex pattern may be provided as a layer separated from the transparent electrode layer 242.

As described above, light which is perpendicularly incident on the tandem solar cell 200 due to the transparent electrode layer 242 having the concave and convex pattern structure is refracted and incident in a diagonal direction toward the perovskite solar cell 220 and the crystalline silicon solar cell 210. Accordingly, a path of incident light passing through the perovskite solar cell 220 and the crystalline silicon solar cell 210 is lengthened, and as a result, a light absorption rate of each solar cell can be improved.

Since a transparent electrode layer of a first electrode is formed to have a concave and convex structure, the above-described tandem solar cell according to the second implementation of the present disclosure is designed to have the textured structure having the texturing pattern in only the lower surface of the crystalline silicon substrate 211.

As a result, even when a textured structure is not provided on an upper surface of a crystalline silicon solar cell, light having a long wavelength and passing through a perovskite solar cell is refracted in a diagonal direction by a transparent electrode layer and is incident on a silicon solar cell, and thus light reflected by an interface between an inter-layer and the silicon solar cell can be reduced.

Figure 5:
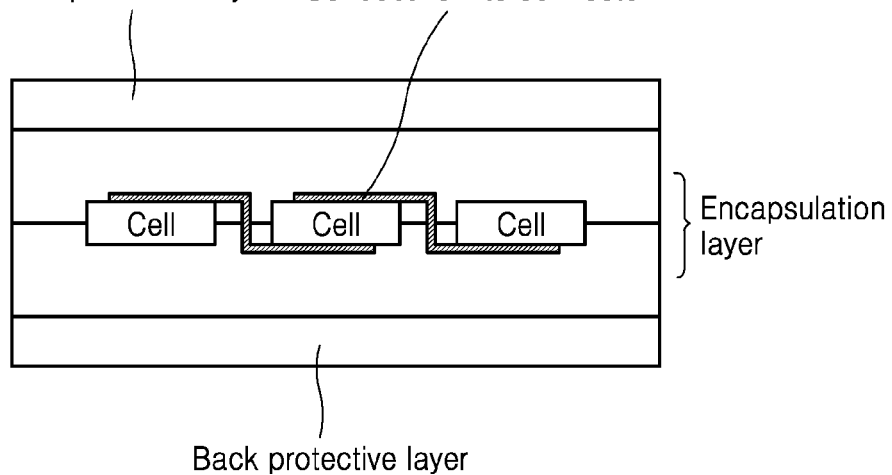
FIG. 5 is a schematic view of a third implementation in which a plurality of solar cells of the present disclosure are connected in series.

FIG. 5 shows a third implementation for describing a modular structure in which a plurality of solar cells of the first implementation or second implementation are connected in series, and shows a structure in which first and second electrodes of adjacent solar cells are electrically connected using conductive interconnectors. The cells connected in series may be encapsulated by a front encapsulant and a rear encapsulant, and a front surface substrate and a rear surface substrate are respectively disposed on the front encapsulant and the rear encapsulant to form a module.

When a metal wire is used as the conductive interconnector, there are a plurality of metal wires connected to the first electrode 140 or 240 of a first solar cell of the plurality of adjacent solar cells and the second electrode 150 or 250 of a second solar cell thereof.

At this time, the metal wire preferably has a cylindrically or elliptically cross-sectional structure. Accordingly, a probability that light which is perpendicularly incident on the metal wire is scattered and re-incident on the tandem solar cell 200 can be increased. Alternatively, a metal ribbon having a tetragonal cross section may be used as the conductive interconnector.

Figure 6:
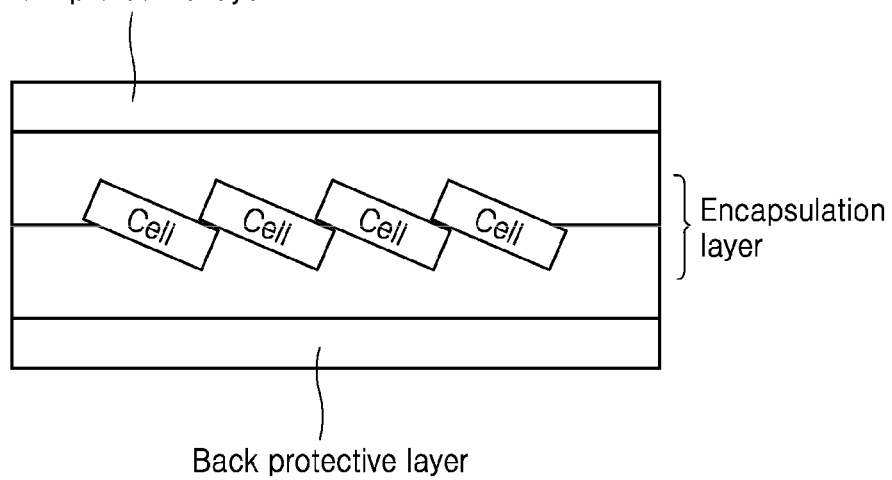
FIG. 6 is a schematic view of a fourth implementation in which the plurality of solar cells of the present disclosure are connected in series.

FIG. 6 shows a fourth implementation for describing a modular structure in which a plurality of solar cells of the first implementation or second implementation are connected in series, and shows a structure in which first electrodes and second electrodes of adjacent cells are overlapped and connected without conductive interconnectors. In this case, a conductive adhesive is used at connecting portions of the electrodes.

In structures of the first electrode and the second electrode, a pad electrode, instead of a grid electrode of the first electrode or the second electrode, may be formed at a location to which the conductive interconnector is connected or a location at which the first electrode overlaps the second electrode for modular connection. Normally, the pad electrode is formed in a direction intersecting with the grid electrode to be connected to a plurality of conductive interconnectors or bonded to electrodes of adjacent cells at an overlapped portion thereof directly or by a conductive adhesive to increase adhesion.

[Method of Manufacturing a Tandem Solar Cell]

FIGS. 7 to 12 are process cross-sectional views illustrating a method of manufacturing the tandem solar cell according to the first implementation of the present disclosure.

Figure 7:
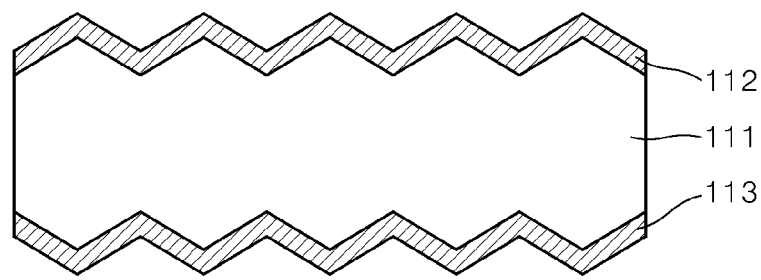
FIGS. 7 to 12 are process cross-sectional views illustrating a method of manufacturing the tandem solar cell according to the first implementation of the present disclosure.

As shown in FIG. 7, a first surface and a second surface of a crystalline silicon substrate 111 are planarized, and then texturing is performed on at least one of the first and second surfaces to form a texturing pattern.

At this time, a textured structure of the crystalline silicon substrate 111 is provided by using one method among a wet chemical etching method, a dry chemical etching method, an electrochemical etching method, and a mechanical etching method, but the present disclosure is not necessarily limited thereto. For example, the textured structure may be provided by etching at least one of the first and second surfaces of the crystalline silicon substrate 111 in a basic aqueous solution.

Then, an emitter layer 112 is formed on the first surface of the crystalline silicon substrate 111. After the emitter layer 112 is formed, a rear electric field layer 113 may further be formed on the second surface of the crystalline silicon substrate 111.

At this time, the emitter layer 112 and the rear electric field layer 113 may be formed by an implanting process. The emitter layer 112 is doped with boron as an impurity, and the rear electric field layer 113 is doped with phosphorous as an impurity. When the emitter layer 112 and the rear electric field layer 113 are formed by an implanting process, a thermal process at 700 to 1,200° C. is preferably performed to activate the impurities. Alternatively, the emitter layer 112 and the rear electric field layer 113 may be formed by a high temperature diffusion process using $BBr_3$, $POCl_3$, or the like instead of an implanting process.

Figure 8:
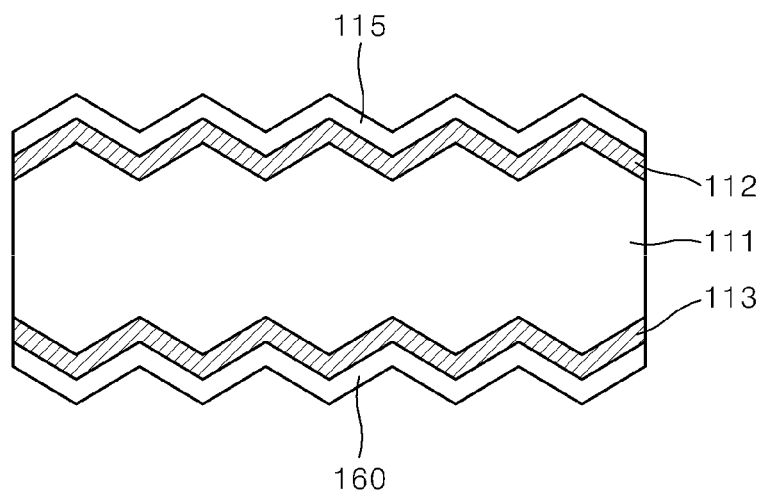

As shown in FIG. 8, a first passivation layer 115 is formed on the emitter layer 112. At this time, after the first passivation layer 115 is formed, a second passivation layer 160 may further be formed on the rear electric field layer 113. Alternatively, the second passivation layer 160 and the first passivation layer 115 may be simultaneously formed.

At this time, the first and second passivation layers 115 and 160 may have different thicknesses. Here, a material of the first passivation layer 115 may generally include a material of $SiN_x$:H containing hydrogen capable of reducing defects of the crystalline silicon substrate 111 or may include another insulating film including hydrogen, or another film or multilayer structure including one or more selected from among $SiO_x$, $SiN_x$, $SiO_xN_y$, $Al_2O_3$, $SiC_x$, and the like may be applied thereto. Further, the second passivation layer 160 is preferably formed by using one or more selected from $SiO_x$, $SiN_x$, $SiO_xN_y$, $Al_2O_3$, $SiC_x$, etc.

Particularly, the first passivation layer 115 is preferably formed to have as thin a thickness as possible to decrease reflectance of light having a long wavelength. To this end, the first passivation layer 115 preferably has a thickness of 10 to 100 nm.

Figure 9:
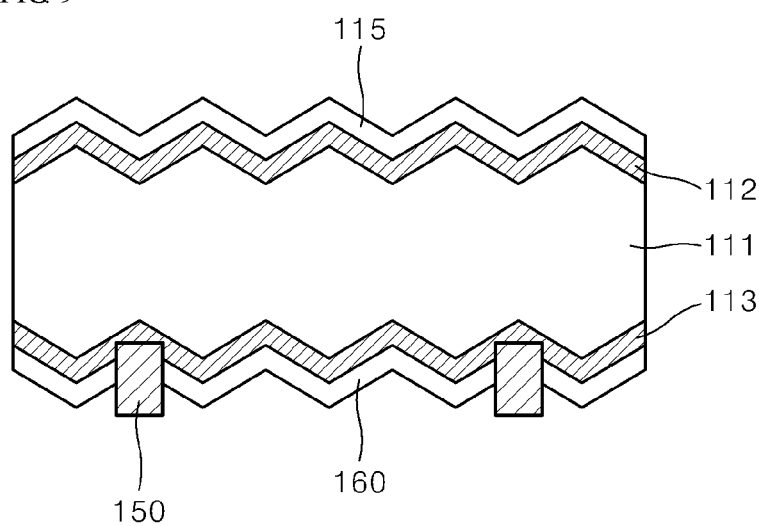

As shown in FIG. 9, a second electrode 150 is formed on the second surface of the crystalline silicon substrate 111.

That is, the second electrode 150 may be formed by printing a second electrode paste on the second passivation layer 160 using a screen printing method, may pass through the second passivation layer 160 during a thermal process having a second temperature, and may be connected to the rear electric field layer 113.

At this time, the second electrode paste may be a paste selected from an Ag paste and an Ag—Al paste. In addition, the second electrode paste may include a glass frit and an inorganic additive for fire-through, and the second temperature may be 700° C. or higher, and more particularly, may be in a range of 700 to 1100° C.

The inorganic additive for fire-through refers to a component capable of allowing a predetermined film to be fired-through a layer at a firing temperature. That is, the term "fire-through" means that the second passivation layer 160 is penetrated due to a chemical reaction with a component included in the second passivation layer 160 during firing.

To this end, the inorganic additive for fire-through may include at least one selected from a nitride, an oxide, a metal having higher oxidizing power than a combination of a nitride and an oxide, and an oxide of the metal. Accordingly, a nitride, an oxide, or a combination thereof is oxidized and the inorganic additive is reduced by high temperature firing, and thus the second passivation layer 160 may be penetrated.

To this end, the inorganic additive for fire-through may include one or more selected from tin (Sn), zinc (Zn), strontium (Sr), magnesium Mg, silver (Ag), lead (Pb), bismuth (Bi), molybdenum (Mo), technetium (Tc), ruthenium (Ru), rhodium (Rh), tungsten (W), rhenium (Re), osmium (Os), iridium (Ir), platinum (Pt), manganese (Mn), chromium (Cr), iron (Fe), copper (Cu), cobalt (Co), palladium (Pd), nickel (Ni), and an oxide thereof.

The second electrode 150 is preferably designed to be selectively disposed on a part of a lower surface of the second passivation layer 160 instead of being disposed on the entire lower surface of the second passivation layer 160 so that photovoltaic light is incident thereon from a lower surface of the silicon solar cell 110. Particularly, the second electrode 150 is preferably disposed to occupy 1 to 30% of a total area of the lower surface of the second passivation layer 160.

Figure 10:
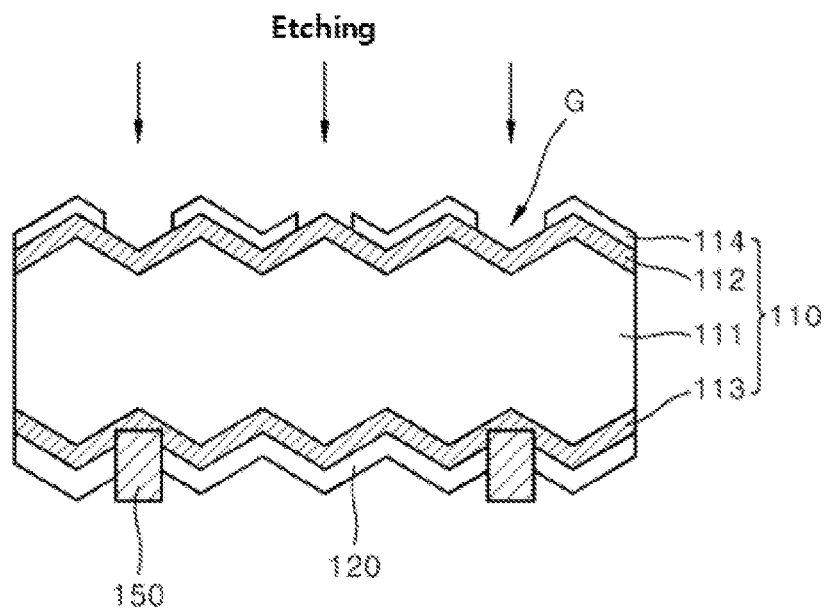

As shown in FIG. 10, the silicon solar cell 110 having a first passivation pattern 114 patterned to have an opening which is made by etching a part of the first passivation layer 115 shown in FIG. 9, that exposes a part of the emitter layer 112 is formed.

At this time, the etching is preferably performed by dry etching, but the present disclosure is not limited thereto. For example, in the case of an etching process using a laser, the first passivation pattern 114 may be formed to have openings G spaced a predetermined gap apart by projecting the laser onto a part of the first passivation layer to remove the part thereof. Here, the first passivation pattern 114 may have a structure in which the openings G having one of a stripe form, a lattice form, and a hole form are disposed by a predetermined gap.

At this time, an area exposed by the openings has to be in a range of 0.1 to 30% of an entire surface of a cell. Electrical characteristics of the cell may be lowered when an opening rate is very small, and it is difficult to reduce efficiency degradation thereof because a passivation effect is reduced when the opening rate is very large.

Figure 11:
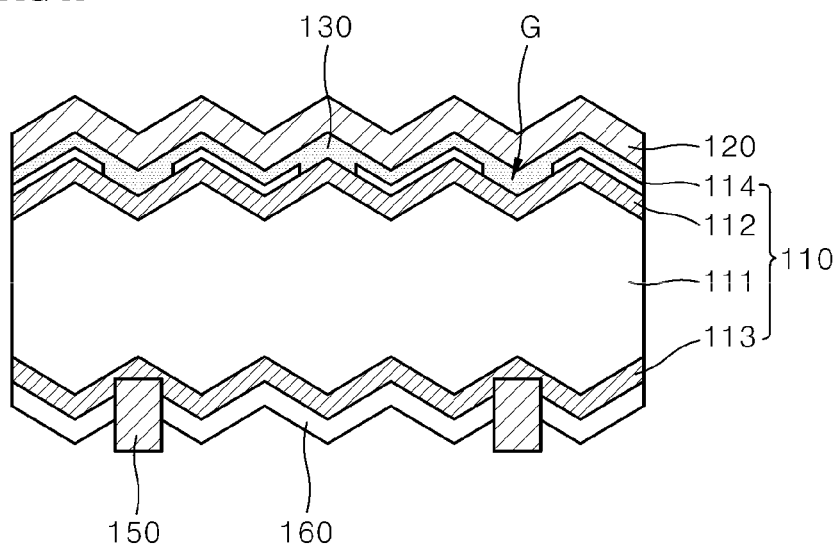

At this time, since the second electrode 150 is formed while an upper portion of the emitter layer 112 is entirely covered by the first passivation layer in the present disclosure, the emitter layer 112 may be stably protected by the first passivation layer during high temperature firing for forming the second electrode 150, surface defects of the emitter layer 112 may not occur, and thus a problem in that characteristics of the perovskite solar cell 120 shown in FIG. 11 are degraded can be reduced.

Further, since the first passivation pattern 114 is formed by selectively etching only a part of the first passivation layer to expose a part of the emitter layer 112 after the high temperature firing is performed to form the second electrode 150, an inter-layer 130, which is stacked on the emitter layer 112 and the first passivation pattern 114 as shown in FIG. 11, is directly bonded to a part of the emitter layer 112 to improve electrical connection reliability between the silicon solar cell 110 and the perovskite solar cell.

As shown in FIG. 11, the inter-layer 130 is formed on the emitter layer 112, which is exposed through the opening and the first passivation pattern 114.

At this time, a material of the inter-layer 130 may include a transparent conductive oxide, a carbonaceous conductive material, a metallic material, or a conductive polymer. In addition, an inter-layer doped with an N-type or P-type material may be used as the inter-layer 130.

At this time, when a transparent conductive oxide, such as ITO, ZITO, ZIO, ZTO, etc., is used for the inter-layer 130, the inter-layer 130 may be deposited by sputtering. In addition, the inter-layer 130 may be an N-type amorphous silicon layer deposited by plasma-enhanced chemical vapor deposition (PECVD) instead of being made of a transparent conductive oxide.

Then, the perovskite solar cell 120 having a perovskite absorption layer is formed on the inter-layer 130.

As shown in FIGS. 3 and 11, a process of forming the perovskite solar cell may include a process of forming an electron transfer layer 121 on the inter-layer 130, a process of forming a perovskite absorption layer 122 on the electron transfer layer 121, and a process of forming a hole transfer layer 123 on the perovskite absorption layer 122.

In addition, a process of forming a mesoporous layer may be additionally performed between the process of forming the electron transfer layer and the process of forming the perovskite absorption layer. The electron transfer layer 121 and the mesoporous layer 125 may be formed of the same metal oxide.

For example, the electron transfer layer 121 may be formed to have a thickness of 5 to 100 nm, and the mesoporous layer 125 may be formed of a $TiO_2$ layer having a thickness of 500 nm or less. The perovskite absorption layer 122 is formed on the entire mesoporous layer 125, and the perovskite absorption layer 122 may fill mesopores included in the mesoporous layer 125 and then may be formed to have a thickness of 100 to 500 nm. The hole transfer layer 123 may be formed to have a thickness of 5 to 100 nm on the perovskite absorption layer 122 using a conductive polymer.

For example, each layer included in the perovskite solar cell 120 may be formed by a physical vapor deposition method, a chemical vapor deposition method, a printing method, or the like. Here, the printing method may include an inkjet printing method, a gravure printing method, a spray coating method, a doctor blade method, a bar coating method, a gravure coating method, a brush painting method, a slot-die coating method, etc.

Figure 12:
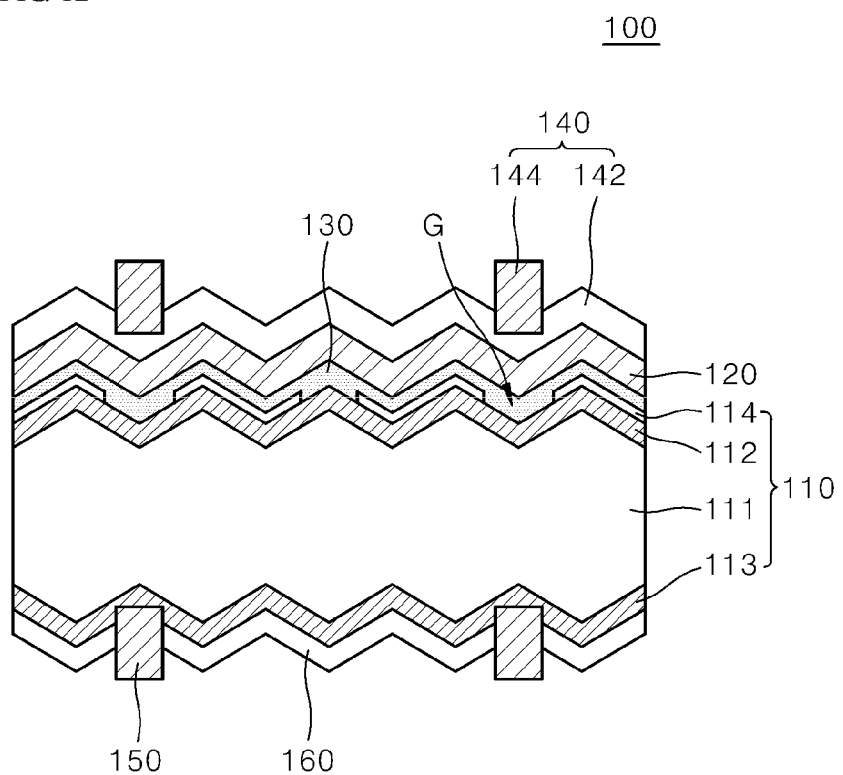

As shown in FIG. 12, a first electrode 140 is formed on the perovskite solar cell 120.

At this time, the first electrode 140 may include a transparent electrode layer 142 disposed on the perovskite solar cell 120 and a grid electrode layer 144 disposed on the transparent electrode layer 142.

At this time, the transparent electrode layer 142 is formed on an entire upper surface of the perovskite solar cell 120 and serves to collect charges generated by the perovskite solar cell 120. The transparent electrode layer 142 may be embodied by using any of various transparent conductive materials. That is, any of the various transparent conductive materials may be the same as a transparent conductive material of the inter-layer 130.

The grid electrode layer 144 is disposed on the transparent electrode layer 142 and is disposed on a part of the transparent electrode layer 142.

At this time, the first electrode 140 may be made by selectively coating the perovskite solar cell 120 with a first electrode paste excluding a glass frit and firing the coated perovskite solar cell 120 at a low temperature of a first temperature. Here, such a first electrode paste may include metal particles and an organic material for a low temperature firing binder, and the first electrode paste excludes a glass frit. Particularly, the first temperature may be 250° C. or lower, and more particularly, may be in a range of 100 to 200° C.

As described above, in the present disclosure, the second electrode 150 and the first electrode 140 are not simultaneously formed, and two processes, in which the second electrode 150 is formed by the firing process at a high temperature of 700° C. or higher before the perovskite solar cell 120 is formed, and the first electrode 140 is formed by the firing process at a low temperature of 250° C. or lower after the perovskite solar cell 120 is formed, are performed, and thereby the perovskite solar cell 120 is not exposed during the firing process at the high temperature of 700° C. or higher.

As a result, the perovskite solar cell 120 is exposed during only the firing process of the low temperature of 250° C. or lower for forming the first electrode 140 and is not exposed during the firing process at the temperature of 700° C. or higher for forming the second electrode 150, and thereby a problem in that the perovskite solar cell 120 is degraded during the high temperature firing can be prevented.

As described above, since the first passivation pattern 114 having a new structure is used in the present disclosure, surface defects of the crystalline silicon substrate 111 can be reduced and characteristics of an element can be improved.

The method of manufacturing a tandem solar cell according to the above-described first implementation of the present disclosure dose not simultaneously form a first electrode and a second electrode and is performed by two processes in which the second electrode is formed by a firing process at a high temperature of 700° C. or higher before a perovskite solar cell is formed, and the first electrode is formed by a firing process at a low temperature of 250° C. or lower after the perovskite solar cell is formed, and thereby the perovskite solar cell is not exposed during the firing process at the high temperature of 700° C. or higher.

As a result, in the method of manufacturing a tandem solar cell according to the first implementation of the present disclosure, the perovskite solar cell is exposed during only the firing process at the low temperature of 250° C. or lower for forming the first electrode and is not exposed during the firing process at the high temperature of 700° C. or higher for forming the second electrode, and thereby a problem in that the perovskite solar cell is degraded during the high temperature firing can be prevented.

According to the present disclosure, a first passivation pattern, in which patterns are designed to be disposed on an emitter layer and spaced a predetermined gap from each other, is provided so that a part of the emitter layer under the first passivation pattern is exposed.

As a result, in a tandem solar cell according to the present disclosure, the emitter layer is protected by the first passivation pattern and surface defects of the emitter layer are reduced during high temperature firing for forming a second electrode, thereby reducing a problem in that characteristic of a perovskite solar cell are degraded.

Further, a tandem solar cell according to the present disclosure can improve electrical connection reliability between a silicon solar cell and a perovskite solar cell by directly bonding an inter-layer, which is stacked on an emitter layer and a first passivation pattern, to a part of the emitter layer using the first passivation pattern.

In addition, a method of manufacturing a tandem solar cell according to the present disclosure does not simultaneously form a first electrode and a second electrode and is performed by two processes, in which the second electrode is formed by a firing process at a high temperature of 700° C. or higher before a perovskite solar cell is formed, and the first electrode is formed by a firing process at a low temperature of 250° C. or lower after the perovskite solar cell is formed, and thereby the perovskite solar cell is not exposed during the firing process at the high temperature of 700° C. or higher.

As a result, in the method of manufacturing a tandem solar cell according to the present disclosure, the perovskite solar cell is exposed during only the firing process at the low temperature of 250° C. or lower for forming the first electrode and is not exposed during the firing process at the high temperature of 700° C. or higher for forming the second electrode, and thereby a problem in that the perovskite solar cell is degraded during the high temperature firing can be prevented.

While the present disclosure has been described with reference to exemplary drawings, it should be understood that the scope of the disclosure is not limited to the disclosed exemplary implementations and drawings, and it should be obvious that various modifications can be made by a person skilled in the art within the scope of the technical idea of the present disclosure. In addition, although the operational effects according to the configuration of the present disclosure were not explicitly described when the implementation of the present disclosure was described above, it should be appreciated that predictable effects due to the configuration should also be allowed.

What is claimed is:

1. A tandem solar cell comprising:
   a first solar cell that includes (i) a crystalline silicon substrate, (ii) an emitter layer coupled to a first surface of the crystalline silicon substrate, and (iii) a first passivation pattern that includes hydrogen, that is coupled to the emitter layer, and that is patterned to have an opening through which a portion of the emitter layer is exposed;
   a second solar cell that includes a perovskite absorption layer;
   a transparent conductive oxide (TCO) inter-layer that is disposed on the first passivation pattern of the first solar cell, that is filled in the opening, and that directly contacts the emitter layer and the second solar cell;
   a first electrode that is coupled to the second solar cell, the first electrode including no glass frit;
   a rear electric field layer disposed on a second surface the crystalline silicon substrate;
   a second passivation layer disposed on the rear electric field layer; and
   a second electrode that directly contacts the rear electric field layer through the second passivation layer, the second electrode comprising a glass frit and an inorganic additive for a thermal process to connect the second electrode to the rear electric field layer through the second passivation layer,
   wherein the second solar cell further includes:
      an electron transfer layer that is coupled to the inter-layer,
      a hole transfer layer that is coupled to the first electrode, and
      a mesoporous layer that is coupled between the electron transfer layer and the perovskite absorption layer.

2. The tandem solar cell of claim 1, wherein the first electrode includes:
   a transparent electrode layer that is coupled to the second solar cell, and
   a grid electrode layer that is coupled to the transparent electrode layer.

3. The tandem solar cell of claim 2, wherein the transparent electrode layer includes a concave structure and a convex structure.

4. The tandem solar cell of claim 1, wherein the first passivation pattern has a thickness of 10 to 100 nm.

5. The tandem solar cell of claim 1, wherein at least one of the first surface of the crystalline silicon substrate or the second surface of the crystalline silicon substrate includes a texturing pattern.

6. The tandem solar cell of claim 1, wherein the first solar cell includes a silicon solar cell and the second solar cell includes a perovskite solar cell.

7. The tandem solar cell of claim 1, wherein an area of the portion of the emitter layer exposed through the opening is in a range of 0.1% to 30% of an entire surface of the first solar cell.

8. The tandem solar cell of claim 1, wherein the rear electric field layer directly contacts the second surface of the crystalline silicon substrate.

9. The tandem solar cell of claim 8, wherein the second passivation layer directly contacts the rear electric field layer.

10. The tandem solar cell of claim 1, wherein the rear electric field layer covers the second surface of the crystalline silicon substrate and separates the second electrode from the second surface of the crystalline silicon substrate.

11. The tandem solar cell of claim 1, wherein the second electrode has:
   a first end that penetrates the second passivation layer, that physically connects to the rear electric field layer, and that is spaced apart from the second surface the crystalline silicon substrate; and
   a second end that protrudes to an outside of the second passivation layer.

12. The tandem solar cell of claim 1, wherein the second passivation layer partly covers the rear electric field layer, and the second electrode occupies 1 to 30% of a total area of a lower surface of the second passivation layer.

13. The tandem solar cell of claim 1, wherein the electron transfer layer is in direct contact with the inter-layer, and the hole transfer layer is in direct contact with the first electrode.

14. The tandem solar cell of claim 1, wherein the mesoporous layer is in direct contact with the electron transfer layer and the perovskite absorption layer.

15. The tandem solar cell of claim 1, wherein the TCO inter-layer includes concave portions protruding toward the second solar cell and convex portions protruding toward the first solar cell relative to the concave portions.

16. The tandem solar cell of claim 15, wherein the first passivation pattern covers at least one of the concave portions or the convex portions.

17. The tandem solar cell of claim 15, wherein the emitter layer includes:
   a first portion that is in direct contact with the concave portions or the convex portions of the TCO inter-layer; and
   a second portion that is in direct contact with the first passivation pattern, and
   wherein the first passivation pattern extends along the TCO inter-layer and is disposed between one of the concave portions and one of the convex portions.

18. The tandem solar cell of claim 17, wherein the first passivation pattern further extends along the TCO inter-layer and cover the one of the concave portions and the one of the convex portions.

* * * * *